(12) United States Patent
Lin et al.

(10) Patent No.: US 8,748,217 B2
(45) Date of Patent: Jun. 10, 2014

(54) METAL-BASED SOLUTION TREATMENT OF CIGS ABSORBER LAYER IN THIN-FILM SOLAR CELLS

(71) Applicant: TSMC Solar Ltd., Taichung (TW)

(72) Inventors: Chih-Ching Lin, Hsinchu (TW);
Yong-Ping Chan, New Taipei (TW);
Kai-Yu Tung, Taichung (TW);
Cheng-Tao Lee, Taipei (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 13/675,017

(22) Filed: Nov. 13, 2012

(65) Prior Publication Data
US 2014/0134784 A1 May 15, 2014

(51) Int. Cl.
*H01L 21/00* (2006.01)

(52) U.S. Cl.
USPC ................ 438/95; 438/84; 257/E31.008

(58) Field of Classification Search
USPC ...................................... 438/84, 95
See application file for complete search history.

(56) References Cited

U.S. PATENT DOCUMENTS

| | | | | |
|---|---|---|---|---|
| 7,611,573 | B2 * | 11/2009 | Bhattacharya | 106/286.6 |
| 2007/0209700 | A1 * | 9/2007 | Yonezawa et al. | 136/265 |
| 2011/0297215 | A1 * | 12/2011 | Malik | 136/255 |
| 2012/0073633 | A1 * | 3/2012 | Fujdala et al. | 136/252 |
| 2013/0005073 | A1 * | 1/2013 | Wang | 438/86 |

OTHER PUBLICATIONS

Soubane, D. "The Role of Cadmium Oxide Within the Thine Films of the Buffer CdS Aimed at Solar Cells Based Upon CIGS Films Fabrication", Jul. 2007, M. J. Condensed Matter, vol. 1, No. 1, pp. 32-34.*

Djebbour, Z. et al., "Ammonia Pretreatment Influence on the Defect Properties of Cu(in,Ga)Se2, Solar Cells from Admittance Spectroscopy", Proceedings of the 3rd World Conference on Photovoltaic Energy Conversion, May 2003, Osaka, Japan, 1:388-391.

\* cited by examiner

*Primary Examiner* — Reema Patel
(74) *Attorney, Agent, or Firm* — Duane Morris LLP

(57) ABSTRACT

A method for manufacturing a thin film solar cell device includes forming a back contact layer on a substrate, forming an CIGS absorber layer on the back contact layer, treating the CIGS absorber layer with a metal-based alkaline solution, and forming a buffer layer on the CIGS absorber layer where the treatment of the CIGS absorber layer improves the adhesion between the CIGS absorber layer and the buffer layer and also improves the quality of the p-n junction at the CIGS absorber layer/buffer layer interface.

10 Claims, 4 Drawing Sheets

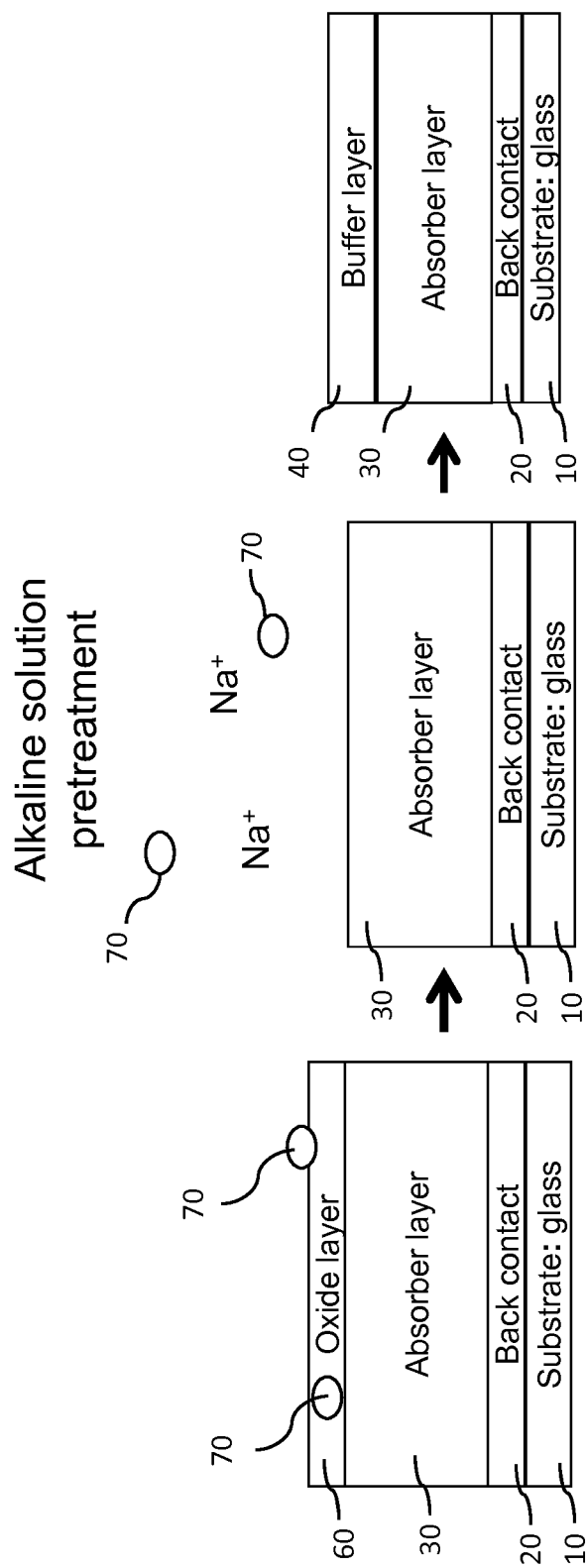

METAL-BASED SOLUTION TREATMENT OF CIGS ABSORBER LAYER IN THIN-FILM SOLAR CELLS

FIELD

The disclosed subject matter generally relates to thin-film solar cell fabrication process.

BACKGROUND

In charcopyrite-based thin film solar cells, N-type buffer layer is conventionally prepared by chemical bath deposition (CBD) without additional treatment. The buffer layer is deposited on the absorber layer and impurities such as oxide or other particles would be directly coated by buffer layer. A ZnO layer is deposited over the buffer layer and after ZnO deposition and lamination, those impurities would result in poor adhesion between the absorber and buffer layer, thereby causing delamination.

Additionally, during CBD process, sodium-based compounds leaching out of the glass substrate along the scribe lines diffuse through the absorber layer and tend to concentrate along the scribe lines. This induces formation of large particulate impurities on the CIGS absorber layer along the scribe lines. Those particles are detrimental to performance of the chalcopyrite-based solar cells as well as their appearance.

After selenization or sulfurization, a thin oxide layer often forms on the surface of absorber layer. This oxide layer degenerates quality of p-n junction, therefore resulting in a decrease of efficiency of cell.

BRIEF DESCRIPTION OF THE DRAWINGS

FIGS. 4, 5 and 6 shows CIGS thin-film partial structures illustrating the benefits of the CIGS absorber layer treatment process according to the present disclosure.

DETAILED DESCRIPTION

Figure 1:
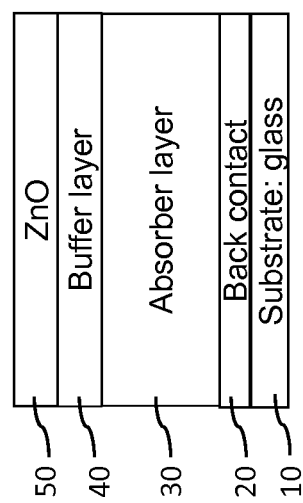
FIG. 1 shows a CIGS thin-film solar cell structure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Referring to FIG. 1, a CIGS thin-film solar cell structure is formed on a glass substrate 10. The solar cell structure comprises a back contact layer 20, which is a first electrode layer made of conductive material such as Mo, formed on the glass substrate 10. A CIGS absorber layer 30 is formed on the back contact layer 20. Next, an N-type buffer layer 40 is deposited on the CIGS absorber layer 30 by CBD. Then, a layer of second electrode layer 50 is deposited on the buffer layer 40. Often, however, impurities such as oxide or other particles get trapped between the CIGS absorber layer 30 and the buffer layer 40. Such impurities at the interface between the CIGS absorber layer 30 and the buffer layer 40 can result in poor adhesion between the CIGS absorber layer 30 and the buffer layer 40 and causing delamination of the layers at the interface.

Additionally, during the CBD process for depositing the N-type buffer layer 40, Na+ ions from the glass substrate, which are typically made of soda glass, diffuse through the CIGS absorber layer 30 along the scribe line. The Na+ ions then form large particle contaminants of sodium-based compounds, such as sodium sulfide or sodium cyanide, concentrated along the scribe line in the buffer layer 40. Such sodium-based compound particle contaminants in the buffer layer 40 are not desired because they can be detrimental to the performance and appearance of the CIGS thin film solar cells and are not desired.

Furthermore, after the selenization and/or sulfurization processing steps, a thin oxide layer 35 form on the surface of the absorber layer 30. The oxide layer 35 tends to degenerate the quality of the p-n junction and decreases the efficiency of the solar cell device structure and is not desired.

These concerns can be eliminated or substantially minimized by the method presented in the present disclosure. A method for manufacturing a thin film solar cell device according to the present disclosure comprises forming a back contact layer on a substrate, forming a CIGS absorber layer on the back contact layer, treating the CIGS absorber layer with a metal-based alkaline solution, and forming a buffer layer on the CIGS absorber layer where the treatment of the CIGS absorber layer improves the adhesion between the CIGS absorber layer and the buffer layer and also improves the quality of the p-n junction at the CIGS absorber layer/buffer layer interface. The treatment may be an in-situ or ex-situ process with the formation of the buffer layer. Preferably, the treatment is an in-situ process with the formation of buffer layer in different tanks of same tool as described in FIG. 3.

According to an embodiment, the surface of the CIGS absorber layer 30 is treated with metal-based solution before the buffer layer 40 is deposited. In one preferred embodiment, the metal-based solution can be a metal-based alkaline solution of $Cd(OH)_2$, $Zn(OH)_2$, or $In(OH)_3$. The treatment of the CIGS absorber layer 30 is carried out with the metal-based solution having a concentration of 0.001M~10M, at temperature of 15 to 90° C. for a duration of 5 to 50 min. In a preferred embodiment, the temperature of the solution is 40 to 80° C. and the duration of the treatment is 5 to 30 min. Treating the CIGS absorber layer 30 with the metal-based solution also results in the metal ions, e.g. Cd, Zn or In ions, to diffuse into the CIGS surface and dope the surface layer of the CIGS. This doping of the CIGS surface layer can form a homo-junction (i.e., a p-n junction) within the CIGS absorber layer with p-type CIGS. This provides the additional benefit of improving the quality of the p-n junction at the CIGS/buffer layer interface because in conventional CIGS solar cell structure without the doping by the metal ions, the CIGS/buffer layer interface just forms a hetero junction p-n junction.

Referring to FIG. 4, as explained above, in a conventional CIGS solar cell process, after the formation of the CIGS absorber layer 30, particulate impurities 70 and thin oxide layer 60 can be found on the surface of the CIGS absorber layer 30 that are not desirable. Referring to FIG. 5, by treating the surface of the CIGS absorber layer 30 using the pretreatment process of the present disclosure, the metal-based solution washes away the particulate impurities 70 and etches away the unwanted thin oxide layer 60 on the surface of the CIGS absorber layer 30 and significantly improves the adhesion between the CIGS absorber layer 30 and the buffer layer 40. This significantly reduce the incidents of delamination at the CIGS absorber and buffer layer interface.

Additionally, in the embodiment where metal-based alkaline solution is used for the treatment of the CIGS absorber layer, because sodium ions (Na+) are soluble in alkaline solutions, the metal-based alkaline solution also washes away Na+ and reduces or eliminates sodium-based compound particle formation in the buffer layer 40. This reduces the formation of the large sodium-based compound particle contaminants and the buffer layer 40 can be deposited on the CIGS absorber layer 30 exhibiting good adhesion, and with improved p-n junction properties. (See FIG. 6).

Furthermore, the metal-based alkaline solution also has the ability to etch away the thin oxide layer that may form at the surface of the CIGS absorber layer 30. This allows the buffer layer 40 to be deposited directly on the absorber layer 30 without the interfering oxide layer. This results in a better p-n junction between the CIGS absorber layer 30 and the buffer layer 40.

Figure 2:
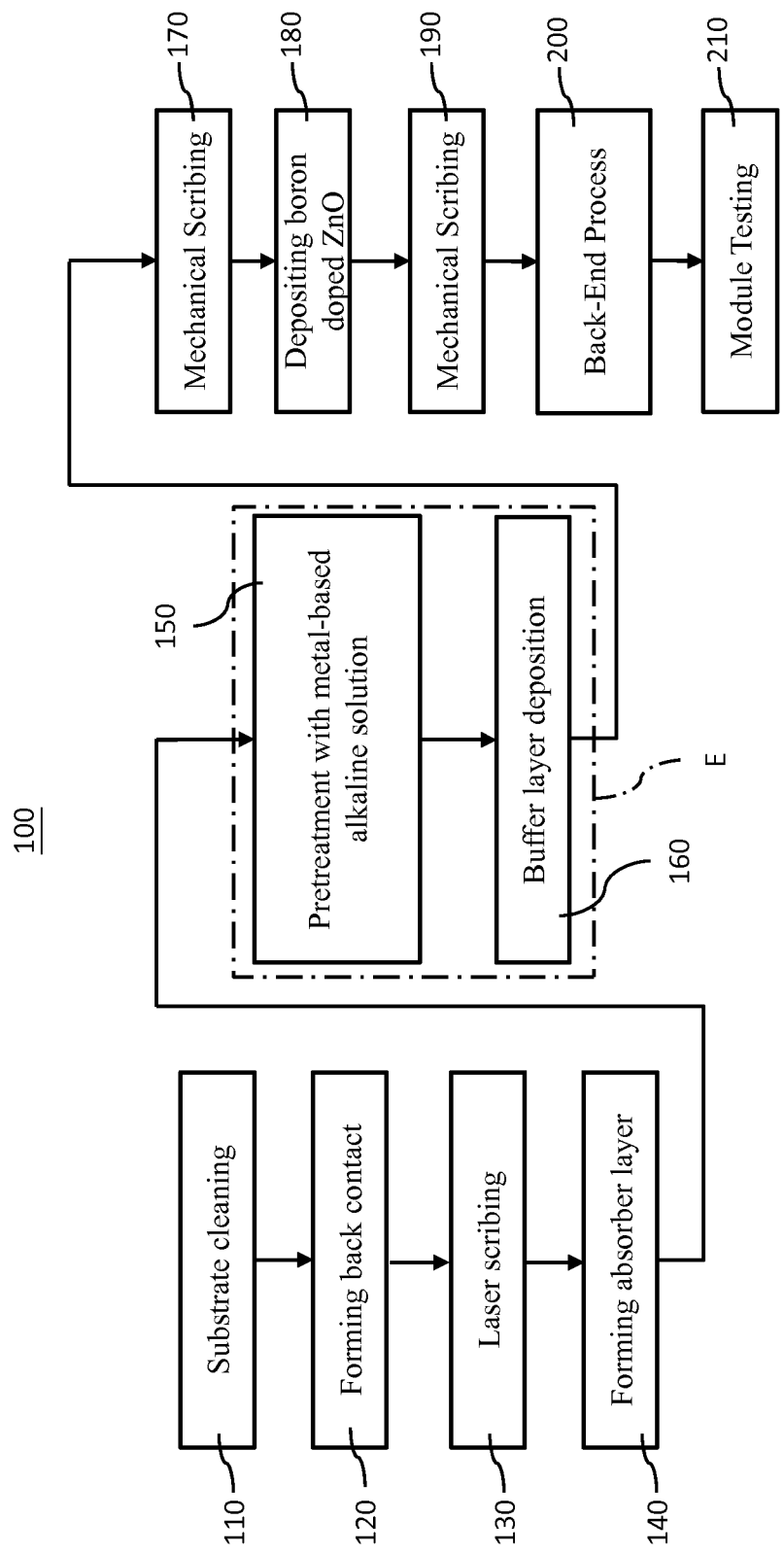
FIG. 2 shows a flowchart of the method according to an embodiment of the present disclosure.

FIG. 2 is a flowchart 100 illustrating the method of forming a CIGS thin-film solar cell structure according to the present disclosure. In step 110, the glass substrate 10 is cleaned. The back contact layer 20 is then formed on the substrate by sputtering Mo, for example. (See box 120). Next, each cell is isolated by laser scribing the Mo film. (See box 130). Next, a CIGS absorber layer 30 is formed. (See box 140). The formation of the CIGS absorber layer actually involves a number of discrete steps such as deposition of Se-rich layer on the back contact layer, deposition of a CIG precursor layer on the Se-rich layer to form an interim structure, selenization, annealing, etc. However, the details of these steps involved in the formation of the CIGS absorber layer 30 is well known in the art and will not be repeated in detail here. After the CIGS absorber layer 30 is formed, the CIGS absorber layer 30 is pretreated with a metal-based solution, such as a metal-based alkaline solution, using the solution concentration, temperature and duration described above. (See box 150). Next, the buffer layer 40 is deposited on the CIGS absorber layer 30 (see box 160) forming an interim solar cell structure. According to an embodiment, the CIGS pre-treatment and the buffer layer deposition are processed in-situ in a same machine environment as denoted by the dashed line E. The remainder of the typical CIGS solar cell fabrication process steps are carried out to complete the CIGS solar cell module. For example, after the buffer layer 40 deposition, a first mechanical scribing is applied to cut off CIGS and CdS. It is used to define circuit paths for future interconnection between front contact (Mo) and back contact (ZnO) (See box 170). Next, boron doped ZnO is deposited on CdS by metal organic chemical-vapor deposition (MOCVD) as the front contact. (See box 180). Next, a second mechanical scribing is applied to wipe off ZnO and CIGS. (See box 190). Next, a back-end process such as encapsulation is carried out (See box 200), and the final solar cell module is tested. (See box 210).

Figure 3:
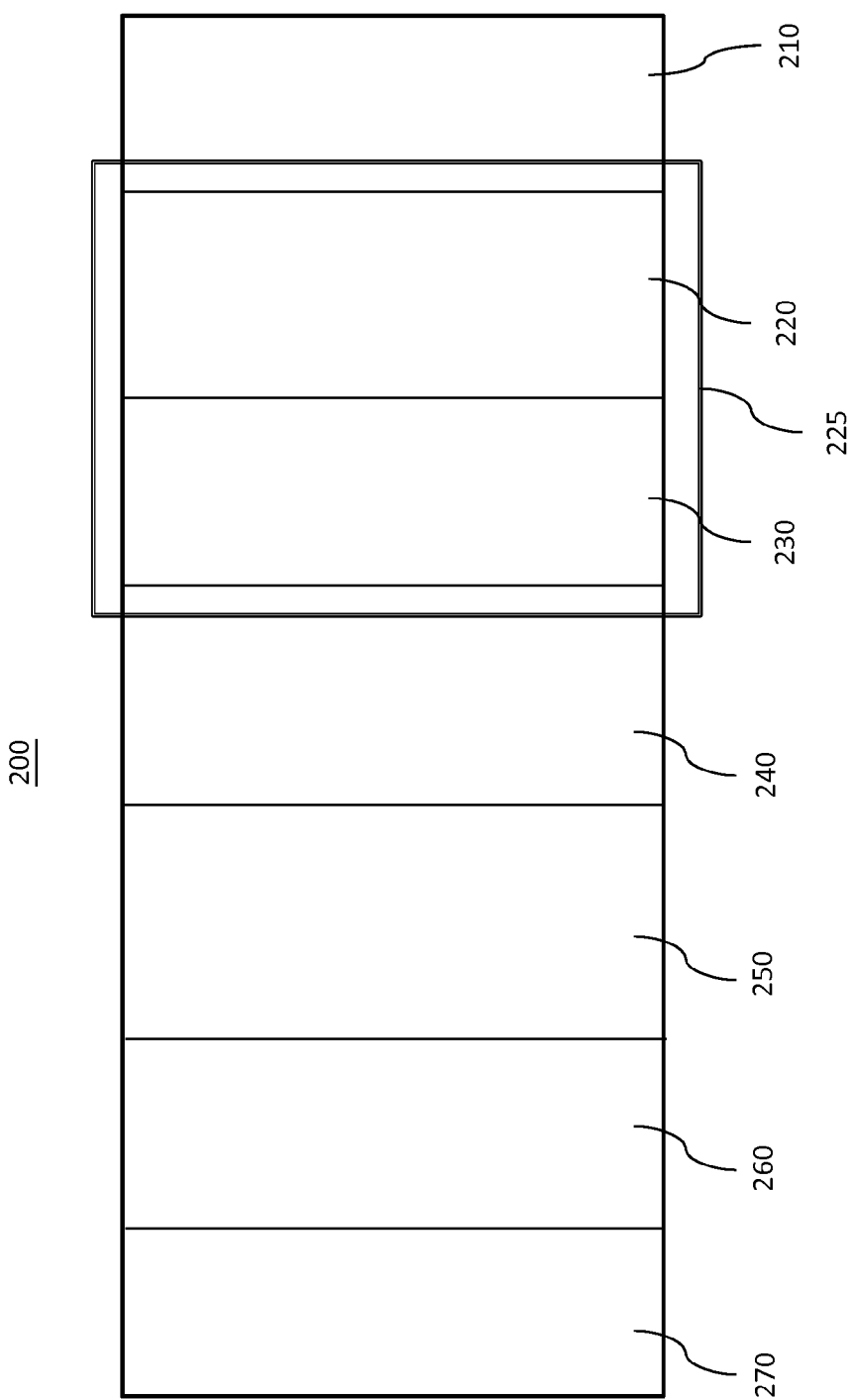
FIG. 3 shows an example of a configuration of a CBD tool that is modified to incorporate the CIGS absorber layer treatment process of the present disclosure.

FIG. 3 shows an example of a layout of a CIGS solar cell fabrication process tool 200 that can be used to carry out the CIGS absorber layer pretreatment process of the present disclosure. The tool 200 comprises a loading station 210 where the substrates having CIGS absorber layer 30 formed thereon are loaded. Next station 220 is the pretreatment tank in which the CIGS absorber layer 30 surfaces are treated with the metal-based solution as described above. Next station 230 is a CBD tank in which the n-type buffer layer 40 is formed on the pretreated CIGS absorber layer 30. According to an embodiment, the CIGS pretreatment tank station 220 and the CBD tank station 230 are configured to perform the CIGS pretreatment and the buffer layer deposition as in-situ processes to reduce particulate or surface oxide impurities on the substrates. The tool 200 is configured to achieve this by providing the CIGS pretreatment tank station 220 and the CBD tank station 230 in a common environment using an enclosure 225, for example. Although the CIGS pretreatment and the buffer layer deposition are carried out in their respective tanks, the two tanks are in a common environment provided by the enclosure 225 and thus the substrates are in the same controlled environment and protects the substrates from the possibilities of particulate contamination or surface oxide impurities. The resulting structure after the buffer layer deposition is an interim solar cell structure. The CBD tank is followed by one or more water tank stations 240, 250 for washing the interim solar cell structure, followed by a drying station 260, then an unloading station 270.

Although the subject matter has been described in terms of exemplary embodiments, it is not limited thereto. Rather, the appended claims should be construed broadly, to include other variants and embodiments, which may be made by those skilled in the art.

What is claimed is:

1. A method for manufacturing a thin film solar cell device comprising the steps of:
   (a) forming a back contact layer on a substrate;
   (b) forming a CIGS absorber layer on the back contact layer, the CIGS absorber layer having a surface;
   (c) treating the surface of the CIGS absorber layer with a metal-based solution of $Cd(OH)_2$, $Zn(OH)_2$, or $In(OH)_3$, whereby corresponding metal ions are produced during the treatment and the metal ions diffuse into the surface of the CIGS absorber layer and dope the surface of the CIGS layer forming a homo-junction within the CIGS absorber layer; and
   (d) forming a buffer layer on the CIGS absorber layer.

2. The method of claim 1, wherein the metal-based solution has a concentration of 0.001M~10M.

3. The method of claim 1, wherein the steps (c) and (d) are carried out in-situ in a common environment.

4. The method of claim 1, wherein the CIGS absorber layer is treated with the metal-based solution that is at a temperature of 15 to 90° C.

5. The method of claim 1, wherein the CIGS absorber layer is treated with the metal-based solution that is at a temperature of 40 to 80° C.

6. The method of claim 1, wherein the CIGS absorber layer is treated with the metal-based solution for a duration of 5 to 30 minutes.

7. A CIGS solar cell fabrication process tool comprising:
   a loading station where substrates having CIGS absorber layer formed thereon are loaded;
   a CIGS pretreatment tank station where the CIGS absorber layers on the substrate are pretreated with a metal-based solution of $Cd(OH)_2$, $Zn(OH)_2$, or $In(OH)_3$;
   a CBD tank for depositing a buffer layer on the CIGS absorber layers, thereby forming interim solar cell structures; and
   one or more water tank stations for washing the interim solar cell structures, wherein the CIGS pretreatment tank station and the CBD tank stations are provided in a common environment thereby allowing the CIGS pretreatment and the buffer layer deposition to be conducted as in-situ processes.

8. The CIGS solar cell fabrication process tool of claim 7, wherein the metal-based solution is at a temperature of 15 to 90° C.

9. The CIGS solar cell fabrication process tool of claim 7, wherein the metal-based solution is at a temperature of 40 to 80° C.

10. The CIGS solar cell fabrication process tool of claim 7, wherein the CIGS absorber layer is treated with the metal-based solution for a duration of 5 to 30 minutes.

\* \* \* \* \*